(12) United States Patent
Shi et al.

(10) Patent No.: US 9,698,360 B2
(45) Date of Patent: Jul. 4, 2017

(54) PACKAGE THIN FILM AND MANUFACTURING METHOD THEREOF, LIGHT EMITTING DEVICE, DISPLAY PANEL AND DISPLAY DEVICE

(71) Applicant: Boe Technology Group Co., Ltd., Beijing (CN)

(72) Inventors: Shoulei Shi, Beijing (CN); Hsiaowen Hung, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/038,524

(22) PCT Filed: Oct. 8, 2015

(86) PCT No.: PCT/CN2015/091430
§ 371 (c)(1),
(2) Date: May 23, 2016

(87) PCT Pub. No.: WO2016/188006
PCT Pub. Date: Dec. 1, 2016

(65) Prior Publication Data
US 2017/0104168 A1    Apr. 13, 2017

(30) Foreign Application Priority Data

May 28, 2015  (CN) .......................... 2015 1 0280981

(51) Int. Cl.
*H01L 51/50* (2006.01)
*H01L 51/00* (2006.01)
(Continued)

(52) U.S. Cl.
CPC ...... *H01L 51/0096* (2013.01); *H01L 51/5246* (2013.01); *H01L 51/5259* (2013.01); *H01L 51/56* (2013.01)

(58) Field of Classification Search
None
See application file for complete search history.

(56) References Cited

U.S. PATENT DOCUMENTS 6,410,142 B1 * 6/2002 Chen ...................... C08G 65/44
428/402
8,143,337 B1 * 3/2012 Lee .......................... C08K 7/04
264/257

(Continued)

FOREIGN PATENT DOCUMENTS

CN         1698938       11/2005
CN        102057750       5/2011
(Continued)

OTHER PUBLICATIONS

Office action from Chinese Application No. 201510280981.4 dated Sep. 5, 2016.
(Continued)

*Primary Examiner* — Michael Lebentritt
(74) *Attorney, Agent, or Firm* — Calfee, Halter & Griswold LLP

(57) ABSTRACT

A package thin film and a manufacturing method thereof, a light emitting device, a display panel and a display device are provided. The package thin film may comprise: a nano material layer or a polycation organic material layer, a moisture absorption layer formed on the nano material layer or the polycation organic material layer, a sealing layer for sealing the nano material layer or the polycation organic material layer and the moisture absorption layer. The package structure provided by embodiments of the present invention is formed by alternate assembly of materials (the nano material layer or the polycation organic material layer and the moisture absorption layer) with different charges.

9 Claims, 2 Drawing Sheets

(51) Int. Cl.
*H01L 51/56* (2006.01)
*H01L 51/52* (2006.01)

(56) References Cited

U.S. PATENT DOCUMENTS

| | | | |
|---|---|---|---|
| 2003/0117066 A1 | 6/2003 | Silvernail | |
| 2004/0067338 A1* | 4/2004 | Kaminsky | B32B 27/20 428/141 |
| 2005/0191490 A1* | 9/2005 | Ton-That | B82Y 30/00 428/407 |
| 2005/0215694 A1* | 9/2005 | Kim | B82Y 30/00 524/445 |
| 2006/0249705 A1* | 11/2006 | Wang | A61L 29/18 252/62.51 C |
| 2009/0278277 A1 | 11/2009 | Gong et al. | |
| 2011/0041914 A1* | 2/2011 | Hasegawa | H01G 9/2077 136/256 |
| 2012/0260980 A1* | 10/2012 | Igarashi | H01G 9/2077 136/256 |
| 2014/0322478 A1* | 10/2014 | Mori | H01L 51/5246 428/76 |
| 2015/0158268 A1* | 6/2015 | Koike | B32B 3/30 156/247 |

FOREIGN PATENT DOCUMENTS

| | | |
|---|---|---|
| CN | 102299118 | 12/2011 |
| CN | 103474561 | 12/2013 |
| CN | 103956435 | 7/2014 |
| CN | 104039544 | 9/2014 |
| CN | 104103660 | 10/2014 |
| CN | 104134756 | 11/2014 |
| CN | 104201295 | 12/2014 |
| KR | 100727236 | 6/2007 |
| WO | 2014/062135 | 4/2014 |
| WO | 2014062135 | 4/2014 |

OTHER PUBLICATIONS

"Synthesis of Montmorillonite/poly(acrylic acid) super absorbent resin", Pingsheng, Liu et al., Acta Materiae Compositae Sinica, vol. 23, No. 2, Jun. 2006, 5 pgs. English Abstract attached.
International Search Report and Written Opinion from PCT/CN2015/091430 dated Mar. 3, 2016.
Office Action from China Application No. 201510280981.4 dated Feb. 15, 2017.

* cited by examiner

PACKAGE THIN FILM AND MANUFACTURING METHOD THEREOF, LIGHT EMITTING DEVICE, DISPLAY PANEL AND DISPLAY DEVICE

RELATED APPLICATIONS

The present application is the U.S. national phase entry of PCT/CN2015/091430, with an international filing date of Oct. 8, 2015, which claims the benefit of Chinese Patent Application No. 201510280981.4, filed on May 28, 2015, the entire disclosures of which are incorporated herein by reference.

FIELD OF THE INVENTION

The present invention relates to a light emitting device, particularly to a package thin film, a method of manufacturing a package thin film, a display panel and a display device.

BACKGROUND OF THE INVENTION

The package structure of the organic light emitting device is an importance part of the organic light emitting device, because the package structure plays the function of blocking water and oxygen, so as to protect normal operation of the organic light emitting device. The packaging method of the conventional organic light emitting device at present is performing packaging through package glass, which can play the function of blocking water and oxygen perfectly. However, the package glass generally has a great thickness; moreover, moisture absorbent should be attached additionally; thus, the thickness of the organic light emitting device will be increased. Moreover, due to the rigidity and stiffness of the package glass, it is difficult to apply such an organic light emitting device on a curved surface display screen. Hence, the defects of the conventional packaging method of the organic light emitting device becomes more and more obvious. In the prior art, another alternative packaging method of the organic light emitting device is a method of depositing organic and inorganic thin films successively. This method can achieve the aim of flexibility, and can also reduce the thickness of the device. However, this method should be performed with expensive deposition device under high vacuum conditions, the cost is generally high.

SUMMARY OF THE INVENTION

Therefore, improved method and device are urgently required to overcome the existing defects in the prior art.

In view of this, a package thin film, a method of manufacturing the package thin film, as well as an organic light emitting device, a display panel and a display device are provided, which can solve or at least mitigate at least part of the defects existing in the prior art.

According to a first aspect of the present invention, a package thin film is provided, which may comprise: a nano material layer or a polycation organic material layer, a moisture absorption layer formed on the nano material layer or the polycation organic material layer, a sealing layer for sealing the nano material layer or the polycation organic material layer and the moisture absorption layer.

By means of the package thin film, a moisture absorption layer is formed on the nano material layer or the polycation organic material layer, and the nano material layer or the polycation organic material layer and the moisture absorption layer are sealed using a sealing layer. In this way, it helps to performing self assembly of each layer according to the principle of layered assembly, so as to achieve the purpose of constructing the package thin film through a simple immersion method. The aim of blocking water and oxygen perfectly can be achieved by selecting appropriate materials.

The package thin film provided by the embodiment of the present invention is a thin film structure, which has excellent flexibility, can be applied on a flexible device, and can realize good compatibility with a roll to roll process.

The package thin film provided by the embodiment of the present invention is realized through alternate construction of different materials. At least part of the materials per se have the characteristics of moisture absorption etc., which can achieve the effect of blocking water and oxygen perfectly; moreover, they have better capability of blocking water and oxygen than a single material.

Such a package thin film provided by the embodiment of the present invention is formed by alternate assembly of materials (the nano material layer or the polycation organic material layer and the moisture absorption layer) with different charges. Different from the vacuum coating method of the prior art, each layer of the package thin film is constructed using a self-assembly method by means of being immersed in a solution, and does not needs expensive vacuum devices anymore. Thereby, the cost is reduced apparently and the manufacturing process is simple, large area manufacturing can be performed. As for how to construct it using the self-assembly method by means of being immersed in the solution, it will be described in detail below.

In an embodiment of the present invention, the moisture absorption layer is a montmorillonite layer. The montmorillonite material is a conventional nanocomposite material, it is a layered Silicate non metallic nano mineral, and has characteristics of good dispersion, distensibility, water absorption and low price etc., and has an extremely wide application scope.

In another embodiment of the present invention, the nano material layer or the polycation organic material layer and the moisture absorption layer are alternately stacked. In the event that the nano material layer or the polycation organic material layer and the moisture absorption layer are alternately stacked, a package thin film of a particular thickness can be formed as needed, which is favorable for achieving the effect of blocking water and oxygen better.

In a further embodiment of the present invention, the nano material layer may be a nano particle layer or a nano fiber layer. The polycation organic material layer may be a polyamine material layer, for example, a branched polyethylene amine (PEI) layer or a poly(diallyldimethylammonium chloride) (PDDA) layer, etc.

According to a second aspect of the present invention, a method of manufacturing a package thin film is provided, which may comprise the steps of: S1, performing pretreatment to a substrate, thereby a surface thereof being provided with positive charges or negative charges; S2, immersing the pretreated substrate in a nano material solution with contrary charges with respect to those in the step S1; S3, taking out and drying the substrate to form a nano material layer or a polycation organic material layer attached on the substrate; S4, immersing the substrate with the nano material layer or the polycation organic material layer in a moisture absorbent solution with charges contrary to the nano material solution; S5, taking out and drying the substrate again to form a moisture absorption layer attached on the nano material layer or the polycation organic material layer; S6, immersing the substrate in a sealant solution; S7, taking out the substrate again so as to cure the sealant adhered to the nano material layer or the polycation organic material layer and the moisture absorption layer to form a sealing layer; S8. stripping the sealing layer from the substrate.

By means of the method of manufacturing a package thin film provided by the embodiment of the present invention, a moisture absorption layer is formed on the nano material layer or the polycation organic material layer, and the nano material layer or the polycation organic material layer and the moisture absorption layer are sealed using a sealing layer. In this way, it helps to performing self assembly of each layer according to the principle of layered assembly, so as to achieve the purpose of constructing the package thin film through a simple immersion method. The aim of blocking water and oxygen perfectly can be achieved by selecting appropriate materials.

The package thin film manufactured by using the above mentioned method is a thin film structure, which has excellent flexibility, can be applied on a flexible device, and can realize good compatibility with a roll to roll process.

Such a packaging method of an organic light emitting device provided by the embodiment of the present invention is formed by alternate assembly of materials (the nano material layer or the polycation organic material layer and the moisture absorption layer) with different charges. Different from the vacuum coating method of the prior art, each layer of the package thin film is constructed using a self-assembly method by means of being immersed in a solution, and does not needs expensive vacuum devices anymore. Thereby, the cost is reduced apparently and the manufacturing process is simple, large area manufacturing can be performed.

In an embodiment of the present invention, the moisture absorbent is a montmorillonite solution. Alternatively, the moisture absorption layer is a montmorillonite layer. The montmorillonite material is a conventional nanocomposite material, it is a layered Silicate non metallic nano mineral, and has characteristics of good dispersion, distensibility, water absorption and low price etc., and has an extremely wide application scope.

In another embodiment of the present invention, steps S2-S5 are repeated for several times to form alternately stacked nano material layers or polycation organic material layers and moisture absorption layers. In the event that the nano material layer or the polycation organic material layer and the moisture absorption layer are alternately stacked, a package thin film of a particular thickness can be formed as needed, which is favorable for achieving the effect of blocking water and oxygen better.

In a further embodiment of the present invention, the nano material layer may be a nano particle layer or a nano fiber layer. The polycation organic material layer may be a polyamine material layer, for example, a branched polyethylene amine (PEI) layer or a poly(diallyldimethylammonium chloride)(PDDA) layer, etc.

According to a third aspect of the present invention, an organic light emitting device packaged using the above mentioned package thin film and/or using a package thin film manufactured by the above mentioned method of manufacturing a package thin film is provided.

According to a fourth aspect of the present invention, a display panel is provided, comprising the above mentioned organic light emitting device.

According to a fifth aspect of the present invention, a display device is provided, comprising the above mentioned display panel.

DETAILED DESCRIPTION OF THE INVENTION

Next, the respective embodiments of the present invention will be described in detail with reference to FIGS. 1-2 of the present invention.

Figure 2:
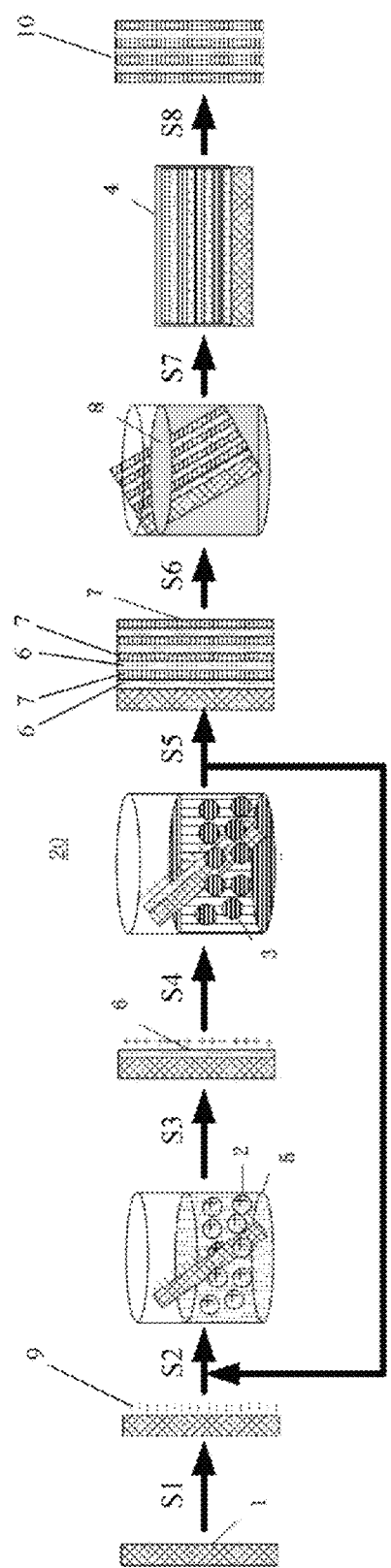
FIG. 2 is a flow chart of manufacturing a package thin film according to an embodiment of the present invention.

FIG. 2 is a flow chart of manufacturing a package thin film according to an embodiment of the present invention. The method of manufacturing a package thin film as shown in FIG. 2 can comprise the steps of:

At step S1, pretreatment is performed to a substrate 1, thereby the surface thereof is provided with positive charges or negative charges. The substrate 1 is a conventional glass substrate or other deposition substrate. The pretreatment method adopted can be oxygen plasma treatment or other electrochemical treatment, which aims to provide positive charges or negative charges to the surface of the substrate 1 with the pretreatment. The step S1 of FIG. 2 shows that the surface of the substrate 1 carries negative charges 9 after the pretreatment. Alternatively, the surface of the substrate 1 can also carry positive charges after the pretreatment.

At step S2, the pretreated substrate 1 is immersed in a nano material solution 5 with contrary charges with respect to those in the step S1. If the surface of the pretreated substrate 1 carries positive charges, the nano material solution 5 to be used subsequently should carry negative charges; if the surface of the pretreated substrate 1 carries negative charges, the nano material solution 5 to be used subsequently should carry positive charges. The purpose of enabling the charges carried by the surface of the pretreated substrate 1 to be contrary to the charges carried by the nano material solution 5 lies in, after immersing the pretreated substrate 1 in the nano material solution 5 with contrary charges for a period of time, enabling the nano material particles with positive charges to be adsorbed to the surface of the substrate 1 with negative charges or enabling the nano material particles with negative charges to be adsorbed to the surface of the substrate 1 with positive charges, so as to form a layer of uniform nano material layer by means of the drying process to be mentioned later through intermolecular electrostatic force (Van der Waals' force). The step S2 in FIG. 2 shows that the pretreated substrate 1 with negative charges is immersed in a solution 5 of nano material 2 with positive charges. The pretreated substrate 1 with negative charges immersed in a solution 5 of nano material 2 with positive charges as shown in step S2 in FIG. 2 is only an example, which has no restrictive meaning. The solution 5 of nano material 2 with positive charges generally contains solvent and solute, the solute is the nano material 2 with positive charges, the solvent is generally a solvent having volatility. The solvent needs to be volatilized completely in the following step S3. Alternatively, the pretreated substrate 1 as shown in step S2 of FIG. 2 can also be immersed in a solution of polycation organic material with positive charges, in the following several steps of this embodiment, a solution of polycation organic materials e.g. branched polyethylene amine (PEI) or poly(diallyldimethylammonium chloride) (PDDA) is used. The nano material 2 and the solution 5 of nano material 2 mentioned in the following steps or in the following embodiments are only for the convenience of explanation, and have no restrictive meanings. It should be noted that the polycation organic materials e.g. branched polyethylene amine (PEI) or poly(diallyldimethylammonium chloride) (PDDA) and the solution of polycation organic materials can also be used in the following situations where the nano material 2 and the solution 5 of nano material 2 are used.

At step S3, the substrate 1 is taken out and dried, so as to enable the solvent in the nano material solution 5 attached on the surface of the substrate 1 to be volatilized completely, thereby forming a nano material layer 2 attached on the substrate 1. The step S3 of FIG. 2 shows that a nano material layer 6 with positive charges is formed after the solvent in the nano material solution 5 on the surface of the substrate 1 is dried and volatilized completely. In respective embodiments of the present invention, the nano material layer 6 may be a nano particle layer or a nano fiber layer. The nano particles can be particles of platinum black, silver, alumina, zinc oxide, titanium dioxide etc., and the nano fibers can be nanotubes or nanowires. In a modified embodiment of the present invention, in the case of using a polycation organic material and a solution of plycation organic material, the polycation organic material layer formed correspondingly can be a polyamine material layer, e.g., a branched polyethylene amine (PEI) layer or a poly(diallyldimethylammonium chloride) (PDDA) layer, etc.

At step S4, the substrate with the nano material layer is immersed in a moisture absorbent solution with charges contrary to the nano material solution. The step S4 of FIG. 2 schematically shows immersing the substrate 1 with the nano material layer 6 with positive charges in a moisture absorbent solution with negative charges. In respective embodiments of the present invention, the moisture absorbent solution can be a montmorillonite solution. The montmorillonite material is a conventional nanocomposite material, it is a layered Silicate non metallic nano mineral, and has characteristics of good dispersion, distensibility, water absorption and low price etc., and has an extremely wide application scope. The moisture absorbent solution with negative charges also contains solvent and solute generally, the solute can be moisture absorbent particles 3 with negative charges, e.g., montmorillonite particles, the solvent is also a solvent having volatility generally. The solvent needs to be volatilized completely in the following step S5.

At step S5, the substrate is taken out and dried again to form a moisture absorption layer attached on the nano material layer. After the substrate is taken out, a moisture absorption layer 7 is formed on the nano material layer 6 of the substrate after the solvent in the moisture absorbent solution e.g., the montmorillonite solution, attached on the nano material layer 6 of the substrate is volatilized completely. The moisture absorption layer 7 formed by moisture absorption components such as montmorillonite has strong water absorption and moisture absorption capability. After the moisture absorbent component such as montmorillonite absorbs water or moisture, it is stiffened generally and the viscosity increases, which is benefit for blocking subsequent moisture and oxygen, thereby playing the function of blocking water and oxygen. The moisture absorbent component such as montmorillonite as referred to here is only an example, and has no restrictive meaning. The skilled person in the art, based on the teaching of this disclosure, can also achieve the teaching of this disclosure by using other moisture absorbents. The step S5 of FIG. 2 shows that the moisture absorption layer 7 with negative charges is formed on the nano material layer 6 with positive charges. The mode of immersion is used either in the preceding step S3 for forming the nano material layer on the surface of the substrate or in the step S5 for forming the moisture absorption layer 7 on the nano material layer 6, by means of opposites attract of the positive and negative charges, the nano material layer 6 and the moisture absorption layer 7 are formed using the method of self assembly, thus it can help to performing self assembly of each layer based on the principle of layered assembly, thereby achieving the purpose of constructing the package thin film through a simple immersion method. The aim of blocking water and oxygen perfectly can be achieved by selecting appropriate materials.

As needed, the steps S2-S5 can be repeated for several times to form alternately stacked nano material layers and moisture absorption layers. For example, alternately stacked layers of nano material layer 6, moisture absorption layer 7, nano material layer 6, moisture absorption layer 7, nano material layer 6, moisture absorption layer 7 . . . are formed on the substrate 1. The moisture absorption layer 7 in respective embodiments of the present invention may be a montmorillonite layer.

At step S6, the substrate is immersed in a sealant solution 8. The sealant solution 8 used in respective embodiments of the present invention can be an epoxy resin solution, a rubber packaging material solution, or a modified silicone resin solution etc.

At step S7, the substrate is taken out again so as to cure the sealant adhered on the nano material layer 6 and the moisture absorption layer 7 to form a sealing layer 4.

At step S8, the sealing layer 4 is stripped from the substrate, a complete package thin film 10 is then obtained after stripping. The package thin film 10 can be used for packaging the subsequent organic light emitting device.

According to the manufacturing method of a package thin film provided by embodiments of the present invention, the package thin film is formed by alternate assembly of materials (the nano material layer or the polycation organic material layer and the moisture absorption layer) with different charges. Different from the vacuum coating method of the prior art, each layer of the package thin film manufactured by the embodiment of the present invention is constructed using a self-assembly method by means of being immersed in a solution. Thus, expensive vacuum devices will not be needed anymore, thereby, the cost is reduced apparently and the manufacturing process is simple, large area manufacturing can be performed.

The package thin film manufactured by using the above mentioned method is a thin film structure, which has excellent flexibility, can be applied on a flexible device, and can realize good compatibility with a roll to roll process.

Figure 1:
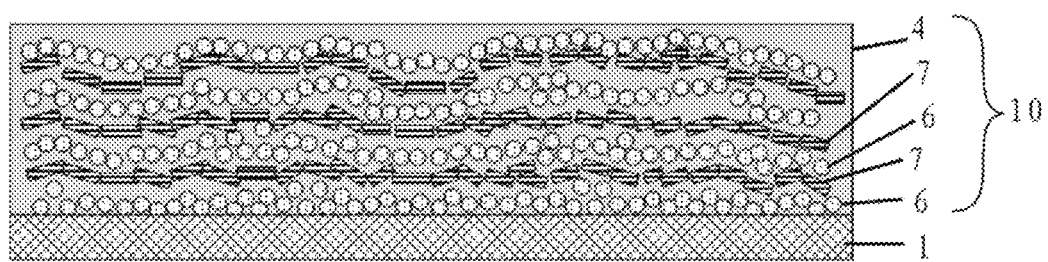
FIG. 1 is a package thin film according to an embodiment of the present invention.

FIG. 1 is a package thin film according to an embodiment of the present invention. FIG. 1 shows a package thin film 10 manufactured on a substrate 1. The package thin film 10 may comprise: a nano material layer 6, a moisture absorption layer 7 formed on the nano material layer 6, and a sealing layer 4 for sealing the nano material layer 6 and the moisture absorption layer 7. In the schematic view as shown in FIG. 1, four layers of nano material layer 6 and three layers of moisture absorption layer 7 are shown. The skilled person in the art can understand that the nano material layer 6 and the moisture absorption layer 7 can be alternately stacked as needed, so as to obtain a particle thickness. Therefore, the four layers of nano material layer 6 and the three layers of moisture absorption layer 7 are only schematic, which does not intend to limit the present invention.

Such a packaging structure of an organic light emitting device provided by the embodiment of the present invention is formed by alternate assembly of materials (the nano material layer or the polycation organic material layer and the moisture absorption layer) with different charges. Different from the vacuum coating method of the prior art, each layer of the package structure is constructed using a self-assembly method by means of being immersed in a solution, and does not needs expensive vacuum devices anymore. Thereby, the cost is reduced apparently and the manufacturing process is simple, large area manufacturing can be performed.

The package thin film provided by the embodiment of the present invention is a thin film structure, which has excellent flexibility, can be applied on a flexible device, and can realize good compatibility with a roll to roll process.

In an embodiment of the present invention, the moisture absorption layer 7 may be a montmorillonite layer.

In another embodiment of the present invention, the nano material layer 6 may be a nano particle layer or a nano fiber layer. The nano particles can be particles of platinum black, silver, alumina, zinc oxide, titanium dioxide etc., and the nano fibers can be nanotubes or nanowires.

An embodiment of the present invention further provides an organic light emitting device packaged using the above mentioned package thin film and/or using the package thin film manufactured by the above mentioned method.

An embodiment of the present invention further provides a display panel, which may comprise the above mentioned organic light emitting device.

An embodiment of the present invention further provides a display device, which may comprise the above mentioned display panel.

Although the present invention has been described with reference to the above mentioned embodiments, it should be understood that the present invention is not limited to the disclosed embodiments. On the contrary, the present invention aims to cover various modifications and equivalent arrangements included within the spirit and scope of the attached claims. The scopes of the following claims comply with the most extensive explanation so as to cover each of such modifications and equivalent structures and functions.

The invention claimed is:

1. A method of manufacturing a package thin film, comprising the steps of:
    performing pretreatment to a substrate, thereby a surface thereof being provided with positive charges or negative charges;
    immersing the pretreated substrate in a nano material solution with contrary charges of performing pretreatment to the substrate;
    taking out and drying the substrate to form a nano material layer or a polycation organic material layer attached on the substrate;
    immersing the substrate with the nano material layer or the polycation organic material layer in a moisture absorbent solution with charges contrary to the nano material solution;
    taking out and drying the substrate again to form a moisture absorption layer attached on the nano material layer or the polycation organic material layer;
    immersing the substrate in a sealant solution;
    taking out the substrate again so as to cure the sealant adhered to the nano material layer or the polycation organic material layer and the moisture absorption layer to form a sealing layer; and
    stripping the sealing layer from the substrate.

2. The method of manufacturing a package thin film according to claim 1, wherein the moisture absorbent solution is a montmorillonite solution.

3. The method of manufacturing a package thin film according to claim 1, wherein the moisture absorption layer is a montmorillonite layer.

4. The method of manufacturing a package thin film according to claim 1, wherein the immerging the pre-treated substrate in the nano material solution, taking out and drying, immersing the substrate in a moisture absorbant solution, and taking out and drying again are repeated for several times to form alternately stacked nano material layers or polycation organic material layers and moisture absorption layers.

5. The method of manufacturing a package thin film according to claim 1, wherein the nano material layer is a nano particle layer or a nano fiber layer.

6. The method of manufacturing a package thin film according to claim 1, wherein the polycation organic material layer is a polyamine material layer.

7. An organic light emitting device packaged using a package thin film manufactured by the method of manufacturing a package thin film as claimed in claim 1.

8. A display panel, comprising the organic light emitting device as claimed in claim 7.

9. A display device, comprising the display panel as claimed in claim 8.

* * * * *